(12) United States Patent
Iijima et al.

(10) Patent No.: US 11,652,094 B2
(45) Date of Patent: May 16, 2023

(54) SEMICONDUCTOR DEVICE AND METHOD OF MANUFACTURING THE SAME

(71) Applicant: KIOXIA CORPORATION, Tokyo (JP)

(72) Inventors: Jun Iijima, Yokkaichi (JP); Yumi Nakajima, Yokkaichi (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/692,954

(22) Filed: Mar. 11, 2022

(65) Prior Publication Data

US 2022/0199603 A1 Jun. 23, 2022

Related U.S. Application Data

(60) Division of application No. 16/783,830, filed on Feb. 6, 2020, now Pat. No. 11,302,684, which is a
(Continued)

(30) Foreign Application Priority Data

Mar. 19, 2018 (JP) .............................. JP2018-051475

(51) Int. Cl.
*H01L 23/48* (2006.01)
*H01L 23/52* (2006.01)
(Continued)

(52) U.S. Cl.
CPC .............. *H01L 25/18* (2013.01); *H01L 24/08* (2013.01); *H01L 24/80* (2013.01);
(Continued)

(58) Field of Classification Search
CPC ..... H01L 24/08; H01L 24/80; H01L 25/0657; H01L 2224/08145; H01L 2224/80894;
(Continued)

(56) References Cited

U.S. PATENT DOCUMENTS 6,638,854 B2 * 10/2003 Homma ................... C09G 1/02
438/692
7,061,112 B2 6/2006 Takao
(Continued)

FOREIGN PATENT DOCUMENTS

JP 2008-027991 2/2008
JP 5132098 1/2013
(Continued)

*Primary Examiner* — Theresa T Doan
(74) *Attorney, Agent, or Firm* — Oblon, McClelland, Maier & Neustadt, L.L.P.

(57) ABSTRACT

In one embodiment, a semiconductor device includes a first interconnection including a first extending portion extending in a first direction, and a first curved portion curved with respect to the first extending portion. The device further includes a second interconnection including a second extending portion extending in the first direction and adjacent to the first extending portion in a second direction, and a second curved portion curved with respect to the second extending portion. The device further includes a first plug provided on the first curved portion, or on a first non-opposite portion included in the first extending portion and not opposite to the second extending portion in the second direction. The device further includes a second plug provided on the second curved portion, or on a second non-opposite portion included in the second extending portion and not opposite to the first extending portion in the second direction.

7 Claims, 7 Drawing Sheets

Related U.S. Application Data continuation of application No. 16/126,018, filed on Sep. 10, 2018, now Pat. No. 10,600,771.

(51) Int. Cl.
*H01L 25/18* (2023.01)
*H01L 25/065* (2023.01)
*H01L 25/00* (2006.01)
*H01L 23/00* (2006.01)

(52) U.S. Cl.
CPC .......... *H01L 25/0657* (2013.01); *H01L 25/50* (2013.01); *H01L 2224/08145* (2013.01); *H01L 2224/80894* (2013.01); *H01L 2225/06524* (2013.01); *H01L 2924/1431* (2013.01); *H01L 2924/14511* (2013.01)

(58) Field of Classification Search
CPC ... H01L 2225/06524; H01L 2924/1431; H01L 2224/0401; H01L 2224/04042; H01L 2224/131; H01L 2224/80896; H01L 2224/94; H01L 2224/97; H01L 2225/0651; H01L 2225/06517; H01L 2225/06541; H01L 2924/1434
USPC ......................................................... 257/777
See application file for complete search history.

(56) References Cited

U.S. PATENT DOCUMENTS

| | | | |
|---|---|---|---|
| 7,838,996 B2 | 11/2010 | Sato et al. | |
| 8,415,741 B2 | 4/2013 | Takaishi | |
| 8,861,279 B2 | 10/2014 | Hishida et al. | |
| 9,911,651 B1* | 3/2018 | Briggs | H01L 21/76811 |
| 2014/0131794 A1 | 5/2014 | Ting et al. | |
| 2015/0069569 A1 | 3/2015 | Okumura et al. | |
| 2016/0079164 A1 | 3/2016 | Fukuzumi et al. | |

FOREIGN PATENT DOCUMENTS

| | | |
|---|---|---|
| JP | 2013-197536 | 9/2013 |
| TW | 201419450 A | 5/2014 |

* cited by examiner

SEMICONDUCTOR DEVICE AND METHOD OF MANUFACTURING THE SAME

CROSS REFERENCE TO RELATED APPLICATION

This application is a divisional of U.S. application Ser. No. 16/783,830 filed Feb. 6, 2020, which is a continuation of U.S. application Ser. No. 16/126,018 filed Sep. 10, 2018, which is based upon and claims the benefit of priority from the prior Japanese Patent Application No. 2018-051475, filed on Mar. 19, 2018, the entire contents of each of which are incorporated herein by reference.

FIELD

Embodiments described herein relate to a semiconductor device and a method of manufacturing the same.

BACKGROUND

When a plug is formed on an interconnection of a semiconductor device, the plug is typically formed on a pad included in the interconnection in order to make it easier to form the plug at a correct position. However, because such a pad makes it difficult to reduce the size of the semiconductor device, it is desirable that the plug can be appropriately and easily formed without using the pad.

DETAILED DESCRIPTION

Embodiments will now be explained with reference to the accompanying drawings.

In one embodiment, a semiconductor device includes a first interconnection including a first extending portion that extends in a first direction, and a first curved portion that is curved with respect to the first extending portion. The device further includes a second interconnection including a second extending portion that extends in the first direction and is adjacent to the first extending portion in a second direction perpendicular to the first direction, and a second curved portion that is curved with respect to the second extending portion. The device further includes a first plug provided on the first curved portion, or provided on a first non-opposite portion that is included in the first extending portion and is not opposite to the second extending portion in the second direction. The device further includes a second plug provided on the second curved portion, or provided on a second non-opposite portion that is included in the second extending portion and is not opposite to the first extending portion in the second direction.

First Embodiment

Figure 1:
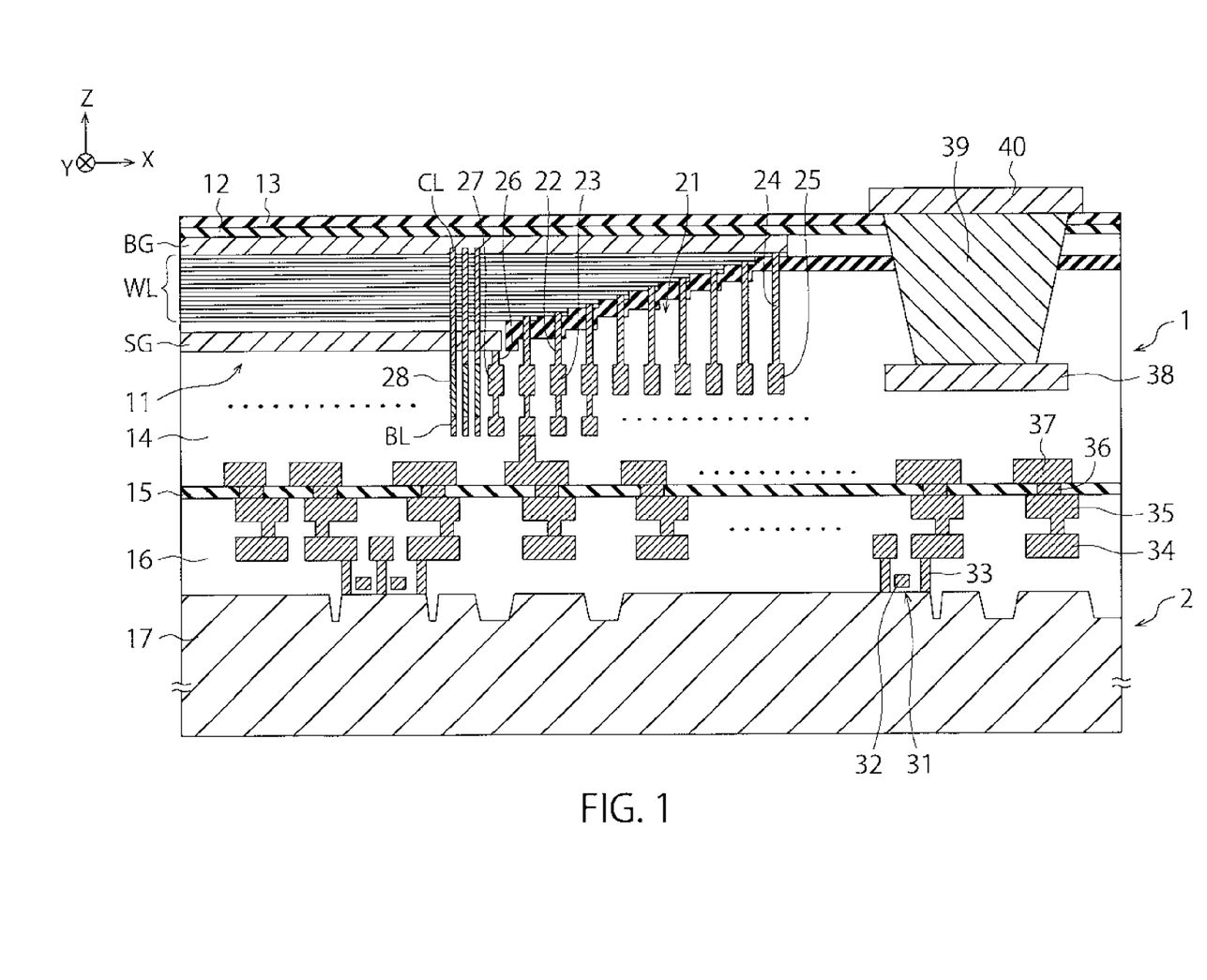
FIG. 1 is a cross-section view illustrating a structure of a semiconductor device in a first embodiment.

FIG. 1 is a cross-section view illustrating a structure of a semiconductor device in a first embodiment. The semiconductor device in FIG. 1 is a three-dimensional memory in which an array chip 1 and a circuit chip 2 are pasted. The array chip 1 is an example of a first chip, and the circuit chip 2 is an example of a second chip.

The array chip 1 includes a memory cell array 11 including a plurality of memory cells, an insulating layer 12 (for example, a silicon nitride film) on the memory cell array 11, an insulating layer 13 (for example, a silicon oxide film) on the insulating layer 12, and an inter layer dielectric 14 under the memory cell array 11.

The circuit chip 2 is provided under the array chip 1 via an insulating layer 15. The circuit chip 2 includes an inter layer dielectric 16 and a substrate 17 under the inter layer dielectric 16. The substrate 17 is, for example, a semiconductor substrate such as a silicon substrate. FIG. 1 illustrates an X direction and a Y direction which are parallel to a surface of the substrate 17 and which are perpendicular to each other, and a Z direction which is perpendicular to the surface of the substrate 17. In the present specification, while a +Z direction is handled as an upward direction, and a −Z direction is handled as a downward direction, the −Z direction may match a gravity direction or does not have to match the gravity direction. A ±Y direction is an example of a first direction, and a ±X direction is an example of a second direction.

The array chip 1 includes a plurality of word lines WL, a back gate BG and a selector gate SG as an electrode layer within the memory cell array 11. FIG. 1 illustrates a step-like structure portion 21 of the memory cell array 11. As illustrated in FIG. 1, each word line WL is electrically connected to a word interconnection layer 23 via a contact plug 22, the back gate BG is electrically connected to a back gate interconnection layer 25 via a contact plug 24, and the selector gate SG is electrically connected to a selector gate interconnection layer 27 via a contact plug 26. The columnar portion CL which pierces through the word lines WL, the back gate BG and the selector gate SG is electrically connected to bit lines BL via plugs 28.

The circuit chip 2 includes a plurality of transistors 31. Each transistor 31 includes a gate electrode 32 provided on the substrate 17 via a gate insulator, and a source diffusion layer and a drain diffusion layer which are provided within the substrate 17 and which are not illustrated. The circuit chip 2 further includes a plurality of plugs 33 provided on the source diffusion layers or the drain diffusion layers of the transistors 31, an interconnection layer 34 including a plurality of interconnections, provided on these plugs 33, and an interconnection layer 35 including a plurality of interconnections provided on the interconnection layer 34. A plurality of metal pads 36 provided within the insulating layer 15 are provided on the interconnection layer 35. The array chip 1 includes an interconnection layer 37 including a plurality of interconnections, provided on these metal pads 36. Each word line WL of the present embodiment is electrically connected to the interconnection layer 37.

The array chip 1 further includes a pad 38 electrically connected to the interconnection layer 37 via a via plug which is not illustrated, an external connection electrode 39 provided on the pad 38, and an external connection pad 40 provided on the external connection electrode 39. The external connection pad can be connected to a mounted substrate or other apparatuses via a solder ball, a metal bump, a bonding wire, or the like.

Figure 2:
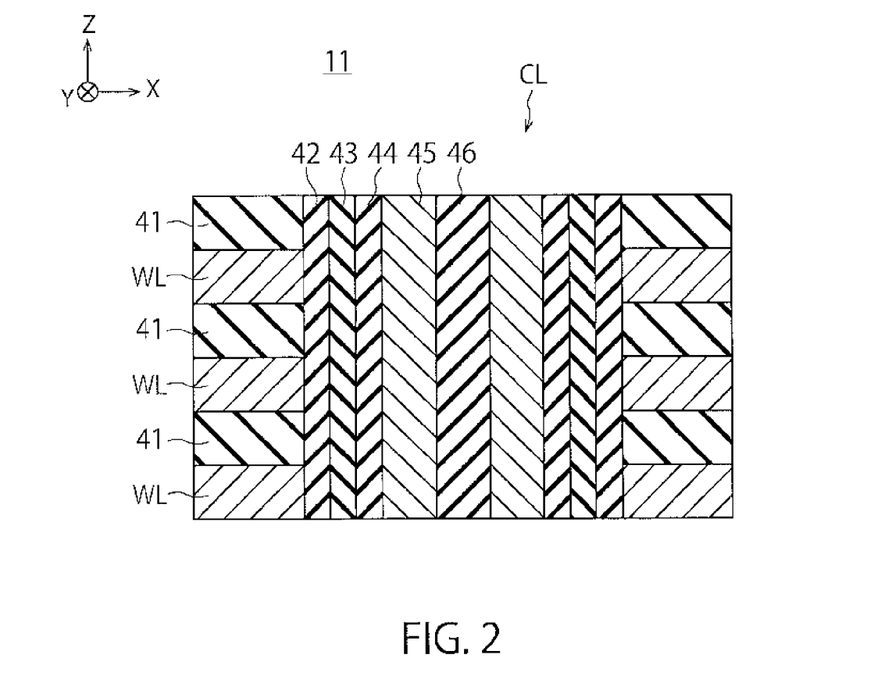
FIG. 2 is a cross-section view illustrating a structure of a columnar portion in the first embodiment.

FIG. 2 is a cross-section view illustrating a structure of a columnar portion CL in the first embodiment.

As illustrated in FIG. 2, the memory cell array 11 includes a plurality of word lines WL and a plurality of insulating layers 41 which are alternately laminated on the inter layer dielectric 14. Each word line WL is, for example, a W (tungsten) layer. Each insulating layer 41 is, for example, a silicon oxide film.

The columnar portion CL includes a block insulator 42, a charge accumulating layer 43, a tunnel insulator 44, a channel semiconductor layer 45 and a core insulator 46. The charge accumulating layer 43, which is, for example, a silicon nitride film, is formed on a side face of the word lines WL and the insulating layer 41 via the block insulator 42. The channel semiconductor layer 45, which is, for example, a silicon layer, is formed on a side face of the charge accumulating layer 43 via the tunnel insulator 44. The block insulator 42, the tunnel insulator 44 and the core insulator 46 are, for example, a silicon oxide film and a metal insulator.

Figure 3:
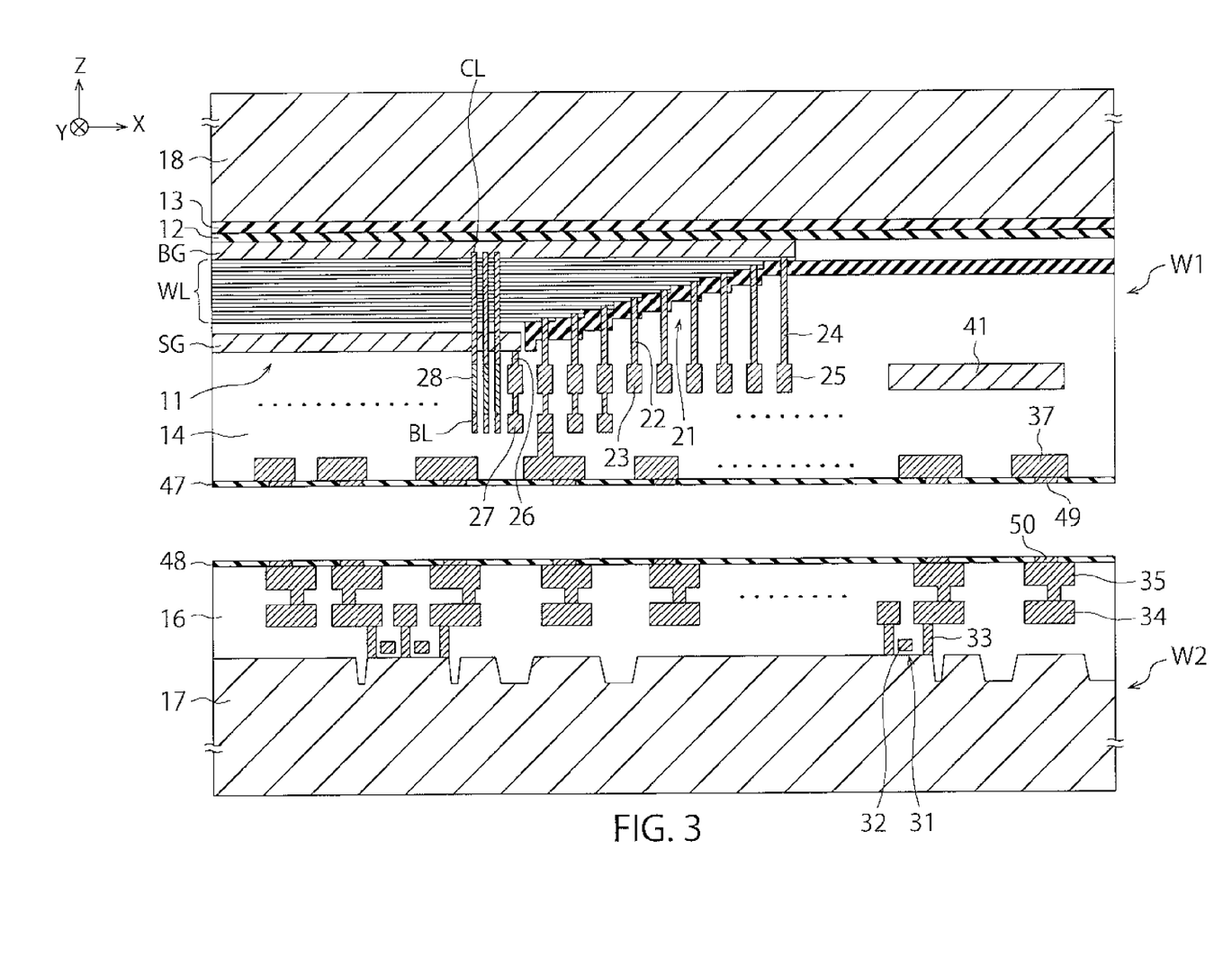
FIG. 3 is a cross-section view illustrating a method of manufacturing the semiconductor device in the first embodiment.

FIG. 3 is a cross-section view illustrating a method of manufacturing the semiconductor device in the first embodiment.

FIG. 3 illustrates an array wafer W1 including a plurality of array chips 1, and a circuit wafer W2 including a plurality of circuit chips 2. FIG. 3 further illustrates a first insulating layer 47 and a plurality of first metal pads 49 provided on a lower face of the array wafer W1, and a second insulating layer 48 and a plurality of second metal pads 50 provided on an upper face of the circuit wafer W2. Each of the first metal pads 49 is provided on a lower face of the interconnection layer 37, and each of the second metal pads 50 is provided on an upper face of the interconnection layer 35. The first and the second metal pads 49 and 50 are respectively examples of first and the second pads. Further, the array wafer W1 includes a substrate 18 on the insulating layer 13.

While, in FIG. 3, the first insulating layer 47 is formed on a lower face of the inter layer dielectric 14, the first insulating layer 47 may be included in and integrated with the inter layer dielectric 14. In a similar manner, while, in FIG. 3, the second insulating layer 48 is formed on an upper face of the inter layer dielectric 16, the second insulating layer 48 may be included in and integrated with the inter layer dielectric 16. In this case, the surfaces of the inter layer dielectrics 14 and 16 are modified through plasma, or the like.

First, the array wafer W1 and the circuit wafer W2 are pasted with mechanical pressure. By this means, the first insulating layer 47 adheres to the second insulating layer 48, so that the insulating layer 15 is formed. Then, the array wafer W1 and the circuit wafer W2 are annealed at 400° C. By this means, the first metal pad 49 is bonded to the second metal pad 50, so that a plurality of metal pads 36 are formed.

Subsequently, the substrate 18 is removed through CMP (Chemical Mechanical Polishing) or wet etching, and the array wafer W1 and the circuit wafer W2 are cut into a plurality of chips. In this manner, the semiconductor device in FIG. 1 is manufactured. The external connection electrode 39 and the external connection pad 40 are formed on the pad 38 after the substrate 18 is removed.

Details of a structure in the vicinity of the metal pad 36 and the interconnection layer 37 will be described later with reference to FIG. 4, or the like.

Figure 4:
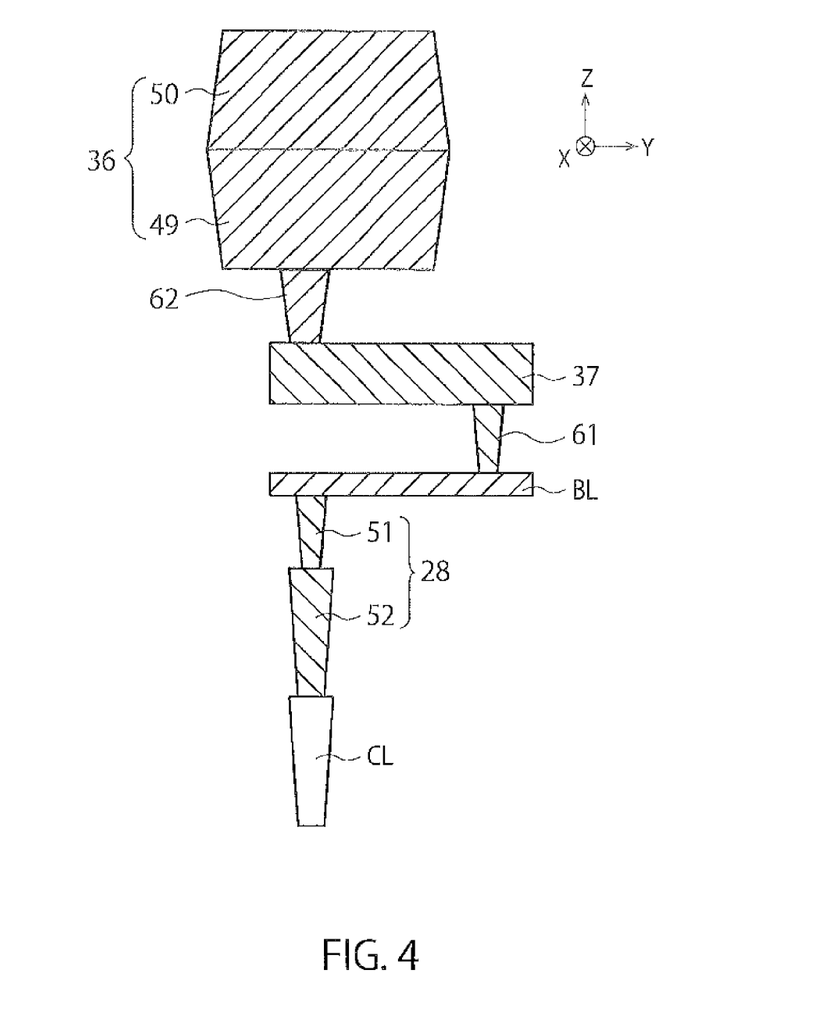
FIG. 4 is a cross-section view for explaining a structure in the vicinity of a bit line in the first embodiment.

FIG. 4 is a cross-section view for explaining a structure in the vicinity of the bit line BL in the first embodiment.

In a similar manner to FIG. 1, FIG. 4 illustrates the columnar portion CL, the plug 28, the bit line BL, the interconnection layer 37 and the metal pad 36. However, it should be noted that an upward direction and a downward direction in FIG. 4 are inverse with respect to an upward direction and a downward direction in FIG. 1. FIG. 4 illustrates a state where the semiconductor device in FIG. 1 is made upside down. This will also similarly apply to FIG. 5 to FIG. 7 which will be described later.

The plug 28 includes a contact plug 52 provided on the columnar portion CL, and a lower via plug 51 provided on the contact plug 52, and the bit line BL is provided on the lower via plug 51. The semiconductor device of the present embodiment further includes an upper via plug 61 provided on the bit line BL, and an interconnection inside the interconnection layer 37 is provided on the upper via plug 61. The semiconductor device of the present embodiment further includes a via plug 62 provided on this interconnection, and the metal pad 36 is provided on the via plug 62. The metal pad 36 includes a first metal pad 49 provided on the via plug 62 and a second metal pad 50 provided on the first metal pad 49.

The semiconductor device of the present embodiment includes a plurality of sets of structures illustrated in FIG. 4, and each structure includes the columnar portion CL, the contact plug 52, the lower via plug 51, the bit line BL, the upper via plug 61, the interconnection inside the interconnection layer 37, the via plug 62, and the metal pad 36. Examples of such a lower via plug 51, a bit line BL and an upper via plug 61 will be described later with reference to FIG. 5 to FIG. 7.

Figure 5:
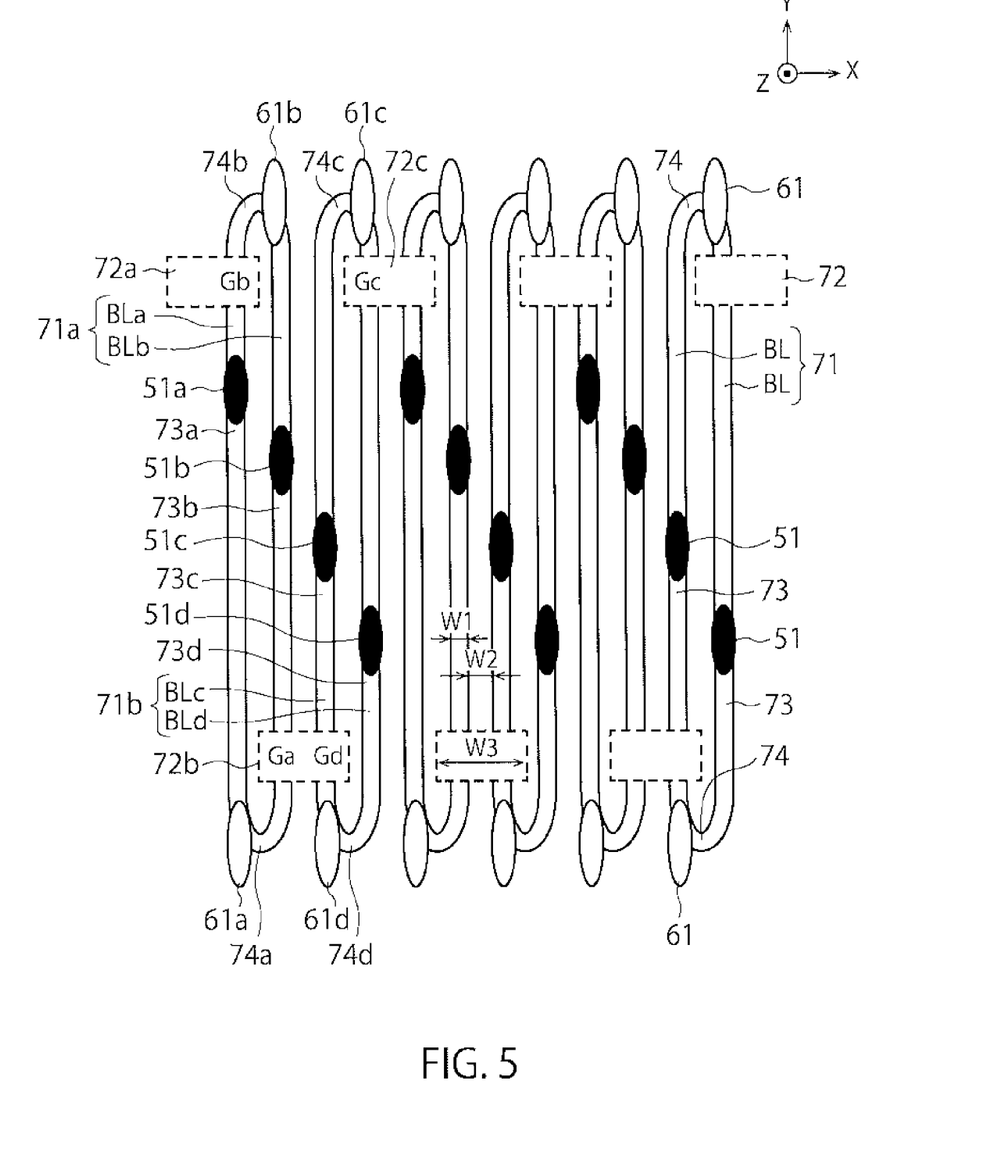
FIG. 5 is a plan view for explaining the structure and the manufacturing method of the semiconductor device in the first embodiment.

FIG. 5 is a plan view for explaining a structure and a manufacturing method of the semiconductor device in the first embodiment.

FIG. 5 illustrates twelve bit lines BL, twelve lower via plugs 51 provided under the bit lines BL, and twelve upper via plugs 61 provided on the bit lines BL. For example, the bit lines BLa to BLd are respectively electrically connected to the lower via plugs 51a to 51d and the upper via plugs 61a to 61d.

These bit lines BL can be formed by, for example, cutting six circular interconnections (loop interconnections) 71 at cutting positions 72. Further, these circular interconnections can be formed by, for example, forming circular interconnections 71 on side faces of a plurality of cores extending in the Y direction and removing the cores thereafter. In FIG. 5, a circular interconnection 71a is cut at a cutting position 71a and a cutting position 71b, and a circular interconnection 71b is cut at the cutting position 71b and a cutting position 71c.

As a result, each circular interconnection 71 is cut into two bit lines BL including an extending portion 73 extending in the Y direction in an extending shape (for example, in a straight-line shape) and a curved portion 74 curved with respect to the extending portion 73. While the curved portion 74 in the present embodiment extends from the extending portion 73 in a curved-line shape (for example, in a U shape or in a J shape), the curved portion 74 may extend from the extending portion 73 in an extending shape if the curved portion 74 is curved with respect to the extending portion 73. For example, the curved portion 74 may extend in the X direction from the extending portion 73 in an extending shape. The extending portion 73 and the curved portion 74 are examples of linear portions, and each bit line BL is an example of an interconnection including linear portions.

For example, a bit line BLa includes an extending portion 73a extending in the Y direction and a curved portion 74a curved with respect to the extending portion 73a. A bit line BLb includes an extending portion 73b extending in the Y direction and adjacent to the extending portion 73a in the X direction and a curved portion 74b curved with respect to the extending portion 73b. A bit line BLc includes an extending portion 73c extending in the Y direction and adjacent to the extending portion 73b in the X direction and a curved portion 74c curved with respect to the extending portion 73c. A bit line BLd includes an extending portion 73d extending in the Y direction and adjacent to the extending portion 73c in the X direction and a curved portion 74d curved with respect to the extending portion 73d. This will also similarly apply to other bit lines BL. The bit lines BLa to BLd are respectively examples of first to fourth interconnections. Further, the ±Y direction is an example of a first direction, and the ±X direction is an example of a second direction.

Because the bit line BLa and the bit line BLb are formed from the same circular interconnection 71a, the curved portion 74a is curved on the extending portion 73b side with respect to the extending portion 73a, and the curved portion 74b is curved on the extending portion 73a side with respect to the extending portion 73b. In a similar manner, because the bit line BLc and the bit line BLd are formed from the same circular interconnection 71b, the curved portion 74c is curved on the extending portion 73d side with respect to the extending portion 73c, and the curved portion 74d is curved on the extending portion 73c side with respect to the extending portion 73d.

FIG. 5 illustrates a width W1 of each extending portion 73, a width W2 between the extending portions 73, and a width W3 of each cutting position 72. For example, the width W2 has a length as long as the width W1, and the width W3 has a length approximately four times as long as the width W1 or the width W2.

In the present embodiment, a film (not illustrated) for etching is formed on the circular interconnections 71, a plurality of openings are formed in this film, and each circular interconnection 71 is cut into two bit lines BL through etching using these openings. Examples of the above-described film can include a resist film and a hard mask film. The cutting positions 72 in FIG. 5 correspond to these openings.

Therefore, the respective openings are formed on the two circular interconnections 71 (more specifically, on the two extending portions 73) as illustrated in FIG. 5.

If the respective openings are formed on one extending portion 73, while the width W3 of each opening becomes ½, with such narrow openings, it is difficult to process or align the openings. However, because, in the present embodiment, the respective openings are formed on two extending portions 73, it is possible to alleviate this problem. In the present embodiment, the cutting position (opening) 71a is provided on the extending portion 72a and on an extending portion adjacent to the extending portion 72a, the cutting position 71b is provided on the extending portion 72b and on the extending portion 72c, and the cutting position 71c is provided on the extending portion 72d and on an extending portion adjacent to the extending portion 72d.

The upper via plugs 61a to 61d are respectively provided on the curved portions 74a to 74d instead of being provided on the extending portions 73a to 73d. A width of the curved portion 74 is approximately three times as wide as the width W1 of the extending portion 73. Therefore, according to the present embodiment, by forming the upper via plugs 61 on the curved portions 74, it is possible to easily form the upper via plugs 61 at correct positions compared to a case where the upper via plugs 61 are formed on the extending portions 73. Meanwhile, the lower via plugs 51a to 51d are respectively provided under the extending portions 73a to 73d. This will also similarly apply to other bit lines BL.

FIG. 5 illustrates a gap Ga between one end portion of the bit line BLa and one end portion of the bit line BLb, and a gap Gb between the other end portion of the bit line BLa and the other end portion of the bit line BLb. Further, FIG. 5 illustrates a gap Gc between one end portion of the bit line BLc and one end portion of the bit line BLd, and a gap Gd between the other end portion of the bit line BLc and the other end portion of the bit line BLd.

These gaps Ga and Gb are formed by cutting each circular interconnection 71 at two cutting positions 72. Therefore, the gap Gb is located within the cutting position 72a, the gaps Ga and Gd are located within the cutting position 72b, and the gap Gc is located within the cutting position 72c. Because the gaps Ga and Gd are both located within the cutting position 72b, the gap Gd is located in the X direction of the gap Ga. The cutting position 72a is an example of a first opening, the gap Gb is an example of a first portion for cutting, and a gap adjacent to the gap Gb is an example of a third portion for cutting. Further, the cutting position 72b is an example of a second opening, the gap Ga is an example of a second portion for cutting, and the gap Gd is an example of a fourth portion for cutting.

The above-described structure is similar in other bit lines BL. The bit lines BL in the present embodiment are configured such that structures similar to those of the bit lines BLa to BLd are periodically repeated in the X direction.

The upper via plugs 61a to 61d may be respectively provided in the +X direction or the −X direction of the gaps Ga to Gd on the extending portions 73a to 73d, i.e., may be respectively provided on non-opposite portions of the extending portions 73a to 73d. The non-opposite portions are provided such that a non-opposite portion of an extending portion of an interconnection is not opposite to an extending portion of an adjacent interconnection in the +X direction or the −X direction. Also in this case, it becomes possible to easily form the upper via plugs 61 at correct positions. Details of such upper via plugs 61 will be described later with reference to FIG. 6.

As described above, the upper via plugs 61 of the present embodiment are formed on the curved portions 74 of the bit lines BL. Therefore, according to the present embodiment, it becomes possible to appropriately and easily form the upper via plugs 61 on the bit lines BL.

Further, in the present embodiment, although the upper via plugs 61 are formed on the bit lines BL, the upper via plugs 61 can be easily brought into contact with the bit lines BL in a wide area. Therefore, according to the present embodiment, it becomes possible to reduce contact resistance between the upper via plugs 61 and the bit lines BL.

Further, in the present embodiment, it becomes not necessary to form pads within the interconnection layer including the bit lines BL, the upper via plugs 61 are directly formed on the bit lines BL instead of being formed on the pads. Therefore, according to the present embodiment, it becomes possible to make the semiconductor device smaller by omitting such pads.

The upper via plugs 61 of the present embodiment may be provided on the extending portions 73 or on the curved portions 74. By this means, it is possible to make it unnecessary to form pads within the interconnection layer including the bit lines BL. However, in the case where the bit lines BL are thin, it becomes difficult to form the upper via plugs 61 at correct positions on the extending portions 73. For example, if misalignment between positions of the extending portions 73 and positions of the upper via plugs 61 occurs, there is a possibility that short circuits between the extending portions 73 or poor connection between the extending portions 73 and the upper via plugs 61 may occur. The bit lines BL tend to be thinner as a result of a three-dimensional structure being employed as a structure of a memory instead of a two-dimensional structure being employed and by the memory being formed through pasting process, which makes it more likely to cause short circuits and poor connection. Therefore, the upper via plugs 61 of the present embodiment are preferably provided on the curved portions 74 rather than being provided on the extending portions 73. Meanwhile, in the case where it is possible to suppress short circuits and poor connection, the upper via plugs 61 of the present embodiment can be provided on the extending portions 73.

Second Embodiment

Figure 6:
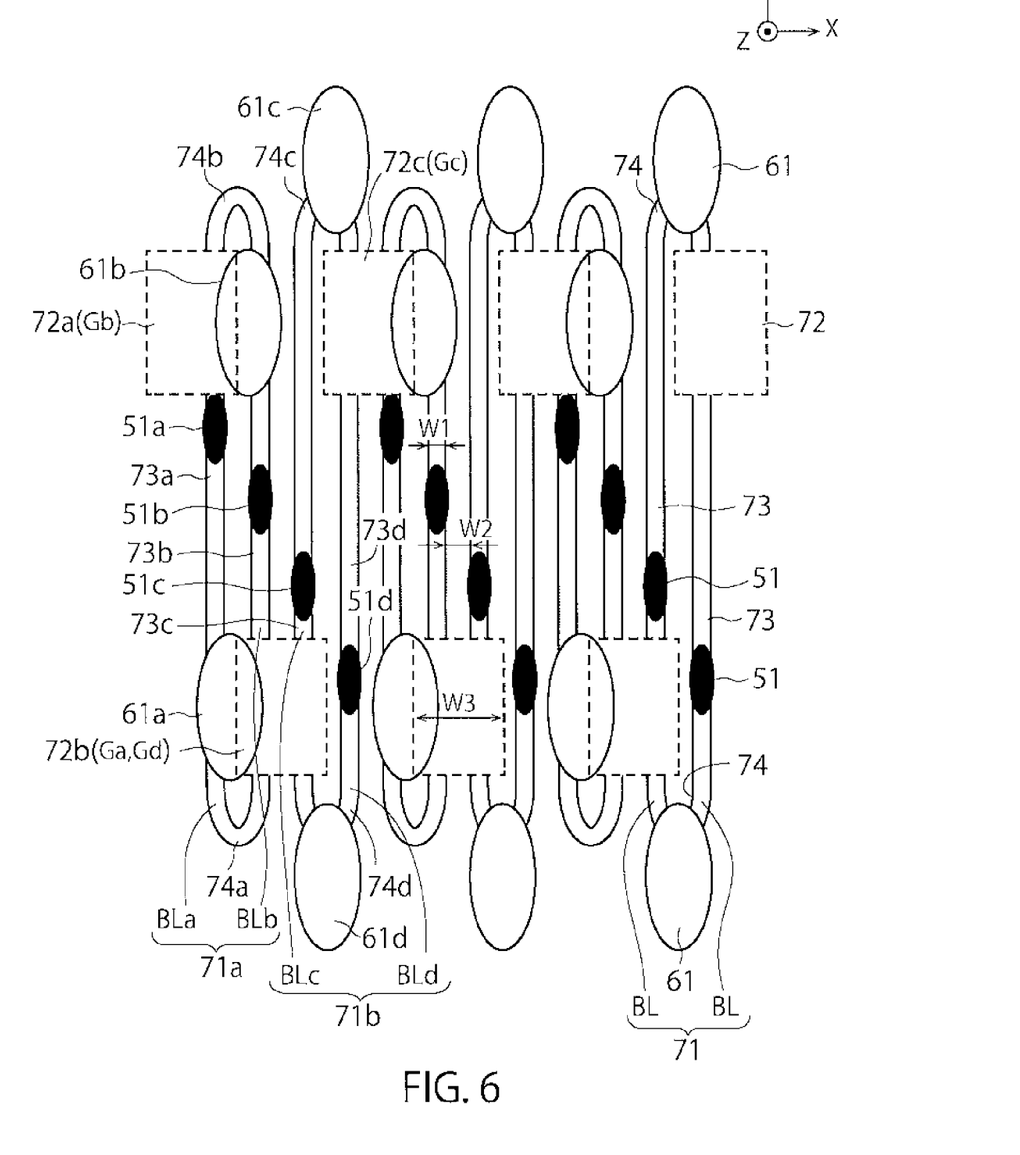
FIG. 6 is a plan view for explaining a structure and a manufacturing method of a semiconductor device in a second embodiment.

FIG. 6 is a plan view for explaining a structure and a manufacturing method of a semiconductor device in a second embodiment.

The semiconductor device of the present embodiment has a structure similar to that of the semiconductor device in the first embodiment. However, an area of an upper face and an area of a lower face of each of the upper via plugs 61 of the present embodiment are respectively set larger than an area of an upper face and an area of a lower face of each of the lower via plugs 51. In FIG. 6, the upper face and the lower face of each of the upper via plugs 61 are respectively surfaces in the +Z direction and the −Z direction of each of the upper via plugs 61. In a similar manner, the upper face and the lower face of each of the lower via plugs 51 are respectively surfaces in the +Z direction and the −Z direction of each of the lower via plugs 51.

Further, an upper via plug 61a of the present embodiment is provided in the +X direction of the gap Ga on the extending portion 73a, and an upper via plug 61b of the present embodiment is provided in the −X direction of the gap Gb on the extending portion 73b. See FIG. 5 regarding details of positions of the gaps Ga and Gb. Meanwhile, upper via plugs 61c and 61d of the present embodiment are respectively provided on curved portions 74c and 74d in a similar manner to the first embodiment. In the present embodiment, such a structure is periodically repeated in the X direction.

Because the areas of the lower faces of the upper via plugs 61 of the present embodiment are large, there is an advantage that the upper via plugs 61 can be easily formed on the bit lines BL. Meanwhile, because the areas of the lower face and the upper face of the upper via plugs 61 of the present embodiment are large, if arrangement similar to that of the upper via plugs 61 in the first embodiment is employed as arrangement of the upper via plugs 61 of the present embodiment, there is a possibility that the upper via plug 61a contacts the upper via plug 61d or a possibility that the upper via plug 61b contacts the upper via plug 61c.

Therefore, the upper via plugs 61a and 61b of the present embodiment are respectively provided in the +X direction or in the −X direction of the gaps Ga and Gb on the extending portions 73a and 73b. Therefore, according to the present embodiment, it is possible to appropriately and easily form the upper via plugs 61 on the bit lines BL while avoiding the upper via plugs 61 from contacting each other.

Third Embodiment

Figure 7:
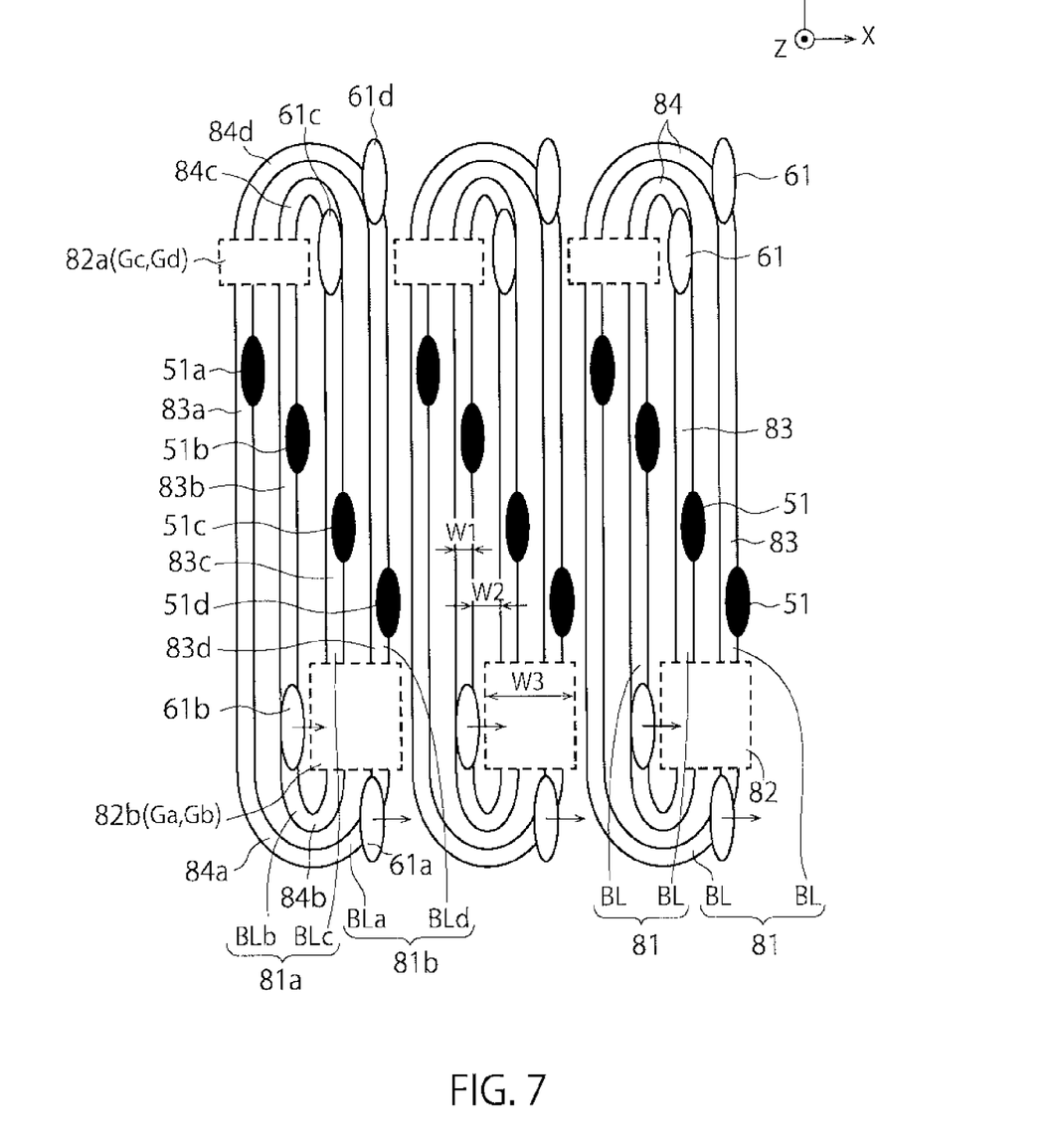
FIG. 7 is a plan view for explaining a structure and a manufacturing method of a semiconductor device in a third embodiment.

FIG. 7 is a plan view for explaining a structure and a manufacturing method of a semiconductor device in a third embodiment. Concerning the present embodiment, differences with the first and the second embodiments will be mainly described, and features in common with the first and the second embodiments will be omitted.

The bit lines BL of the present embodiment can be formed by cutting six circular interconnections (loop interconnections) 81 at cutting positions 82. Further, these circular interconnections 81 can be formed by forming a plurality of second cores on side faces of a plurality of first cores extending in the Y direction, removing the first cores thereafter, forming the circular interconnections 81 on the side faces of the second cores, and removing the second cores thereafter. In FIG. 7, a circular interconnection 81a is cut at a cutting position 82a and a cutting position 82b, and a circular interconnection 81b is also cut at the cutting position 82a and the cutting position 82b. The circular interconnection 81b surrounds the circular interconnection 81a, and this will also similarly apply to other circular interconnections 81.

As a result, each circular interconnection 81 is divided into two bit lines BL including an extending portion 83 extending in the Y direction in an extending shape, and a curved portion 84 curved with respect to the extending portion 83. While the curved portion 84 of the present embodiment extends from the extending portion 83 in a curved-line shape (for example, in a U shape or in a J shape), the curved portion 84 may extend from the extending portion 83 in an extending shape if the curved portion 84 is curved with respect to the extending portion 83.

For example, the curved portion 84 may extend in the X direction from the extending portion 83 in an extending shape. The extending portion 83 and the curved portion 84 are examples of linear portions, and each bit line BL is an example of an interconnection including the linear portions.

For example, a bit line BLb includes an extending portion 83b extending in the Y direction, and a curved portion 84b curved with respect to the extending portion 83b. A bit line BLc includes an extending portion 83c extending in the Y direction and adjacent to the extending portion 83b in the X direction, and a curved portion 84c curved with respect to the extending portion 83c. The bit lines BLb and BLc are formed from a circular interconnection 81a. Further, a bit line BLa includes an extending portion 83a extending in the Y direction and adjacent to the extending portion 83b in the −X direction, and a curved portion 84a curved with respect to the extending portion 83a. A bit line BLd includes an extending portion 83d extending in the Y direction and adjacent to the extending portion 83c in the X direction, and a curved portion 84d curved with respect to the extending portion 83d. The bit lines BLa and BLd are formed from a circular interconnection 81b. This will also similarly apply to other bit lines BL. The bit lines BLb, BLc, BLa and BLd of the present embodiment are respectively examples of first to fourth interconnections.

Because the bit line BLb and the bit line BLc are formed from the same circular interconnection 81a, the curved portion 84b is curved on the extending portion 83c side with respect to the extending portion 83b, and the curved portion 84c is curved on the extending portion 83b side with respect to the extending portion 83c. In a similar manner, because the bit line BLa and the bit line BLd are formed from the same circular interconnection 81b, the curved portion 84a is curved on the extending portion 83d side with respect to the extending portion 83a, and the curved portion 84d is curved on the extending portion 83a side with respect to the extending portion 83d. Further, because the circular interconnection 81b surrounds the circular interconnection 81a, radii of curvature of the curved portions 84a and 84d are greater than radii of the curved portions 84b and 84c.

In the present embodiment, a film (not illustrated) for etching is formed on the circular interconnections 81, a plurality of openings are formed in this film, and each circular interconnection 81 is cut into two bit lines BL through etching using these openings. Examples of the above-described film can include a resist film and a hard mask film. The cutting positions 82 in FIG. 7 correspond to these openings. Therefore, the respective openings are formed on two circular interconnections 81 (more specifically, on two extending portions 83) as illustrated in FIG. 7.

The semiconductor device of the present embodiment includes a gap Gb between one end portion of the bit line BLb and one end portion of the bit line BLc within the cutting position 82b, and includes a gap Gc between the other end portion of the bit line BLb and the other end portion of the bit line BLc within the cutting position 82a. The semiconductor device of the present embodiment further includes a gap Ga between one end portion of the bit line BLa and one end portion of the bit line BLd within the cutting position 82b and includes a gap Gd between the other end portion of the bit line BLa and the other end portion of the bit line BLd within the cutting position 82a.

These gaps Ga and Gb are formed by cutting each circular interconnection 81 at two cutting positions 82. Therefore, the gaps Ga and Gb are located within the cutting position 82b, and the gaps Gc and Gd are located within the cutting position 82a. Because the gaps Ga and Gb are both located within the cutting position 82b, the gap Ga is located in the X direction of the gap Gb. Because the gaps Gc and Gd are both located within the cutting position 82a, the gap Gc is located in the X direction of the gap Gd. The cutting position 82b of the present embodiment is an example of a first opening, the gap Gb is an example of a first portion for cutting, and the gap Ga is an example of a third portion for cutting. Further, the cutting position 82a of the present embodiment is an example of a second opening, the gap Gc is an example of a second portion for cutting, and the gap Gd is an example of a fourth portion for cutting.

In the present embodiment, the upper via plug 61b is provided in the −X direction of the gaps Ga and Gb on the extending portion 83b, and the upper via plug 61c is provided in the +X direction of the gaps Gc and Gd on the extending portion 83c. Further, the upper via plug 61a is provided on the curved portion 84a, and the upper via plug 61d is provided on the curved portion 84d. Therefore, according to the present embodiment, in a similar manner to the first and the second embodiments, it becomes possible to easily form these upper via plugs 61 at correct positions. This will also similarly apply to other bit lines BL.

A right arrow on the upper via plug 61a indicates a case where a position where the upper via plug 61a is formed is displaced in a direction of arrow (+X direction). Because the upper via plug 61a of the present embodiment is located on a right side of a top of the curved portion 84a, short circuits are less likely to occur even if such displacement occurs. In a similar manner, because the upper via plug 61d of the present embodiment is located on a right side of a top of the curved portion 84d, short circuits are less likely to occur even if such displacement occurs. Therefore, such arrangement of the upper via plugs 61a and 61d is effective, for example, in the case where positions where the upper via plugs 61a and 61d are formed tend to be displaced in the +X direction. On the other hand, in the case where the positions where the upper via plugs 61a and 61d are formed tend to be displaced in the −X direction, the upper via plugs 61a and 61d may be disposed on a left side of the tops of the curved portions 84a and 84d.

The above-described structure will also similarly apply to other bit lines BL. The bit lines BL of the present embodiment are configured such that structures similar to those of the bit lines BLa to BLd are periodically repeated in the X direction.

As described above, the upper via plugs 61 of the present embodiment are formed on the curved portions 84 of the bit lines BL or formed on the extending portions 83 of the bit lines BL so as to be adjacent to gaps between the bit lines BL.

Therefore, according to the present embodiment, it becomes possible to appropriately and easily form the upper via plugs 61 on the bit lines BL in a similar manner to the first and the second embodiments.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:
1. A semiconductor device comprising:
a first chip including:
    a substrate, and
    a transistor provided on the substrate;
a second chip bonded to the first chip and including:
    a first interconnection included in a plurality of interconnections in an interconnection layer,
    a first via plug provided above and in contact with the first interconnection,
    a first bit line provided above and in contact with the first via plug, and extending in a first direction parallel to a surface of the substrate,
    a second via plug provided above and in contact with the first bit line, and
    a columnar portion provided above and electrically connected to the second via plug, including a semiconductor layer and a charge accumulating layer, and extending in a second direction perpendicular to the surface of the substrate;
a metal pad body provided on a bonding surface of the first chip and the second chip, and electrically connecting the transistor of the first chip to the first interconnection of the second chip,
wherein
the first via plug has a first width in the first direction,
the first interconnection has a second width in the first direction, and
the second width of the first interconnection is greater than the first width of the first via plug.
2. The device of claim 1, further comprising a memory cell array provided in the second chip, and including a plurality of electrode layers and a plurality of insulating layers that are alternately stacked,
wherein the columnar portion is provided in the plurality of electrode layers and the plurality of insulating layers.

3. The device of claim 1, wherein the plurality of electrode layers function as word lines.

4. The device of claim 1, wherein a position where the second plug contacts the first bit line is shifted from a position where the first plug contacts the first bit line in the first direction.

5. The device of claim 1, wherein
the first bit line includes a linear portion that extends in a straight-line shape or in a curved-line shape, and
the first plug is provided under the linear portion.

6. The device of claim 5, wherein
the linear portion includes at least a straight-line portion that extends in a straight-line shape, and a bent portion that is bent with respect to the straight-line portion, and
the first plug is provided under the straight-line portion.

7. The device of claim 5, wherein
the linear portion includes at least a straight-line portion that extends in a straight-line shape, and a bent portion that is bent with respect to the straight-line portion, and
the first plug is provided under the bent portion.

* * * * *